United States Patent [19]
Nagai et al.

[11] Patent Number: 6,028,415
[45] Date of Patent: Feb. 22, 2000

[54] CHARGING CONTROL METHOD AND CHARGING CONTROL DEVICE

[75] Inventors: Tamiji Nagai; Toshitaka Takei, both of Kanagawa; Kuniharu Suzuki, Tokyo, all of Japan

[73] Assignee: Sony Corporation, Tokyo, Japan

[21] Appl. No.: 09/192,907

[22] Filed: Nov. 16, 1998

[30] Foreign Application Priority Data

Nov. 28, 1997  [JP]  Japan ................................ P09-329257

[51] Int. Cl.[7] ...................................................... H02J 7/00
[52] U.S. Cl. ........................................... 320/162; 320/137
[58] Field of Search ..................................... 320/162, 137

[56] References Cited

U.S. PATENT DOCUMENTS

| | | | |
|---|---|---|---|
| 5,576,608 | 11/1996 | Nagai et al. | 320/159 |
| 5,637,981 | 6/1997 | Nagai et al. | 320/160 |
| 5,680,027 | 10/1997 | Hiratsuka et al. | 320/106 |

*Primary Examiner*—Peter S. Wong
*Assistant Examiner*—Gregory J. Toatley, Jr.
*Attorney, Agent, or Firm*—Jay H. Maioli

[57] ABSTRACT

A charging control method and apparatus for controlling the charging of a secondary battery includes a charging unit that outputs a constant voltage and constant current and a battery unit that includes a secondary battery. The charging unit has a constant voltage constant-current circuit for supplying a fixed voltage and a fixed current and a first voltage detection circuit for comparing the output voltage from the constant-voltage constant-current circuit with a first threshold level and generating a first detection signal corresponding to the comparison result. The battery unit also includes a second voltage detection circuit for comparing the charging voltage of the secondary battery with the first threshold level and generating a second detection signal corresponding to the comparison result. The charging unit further includes an output control circuit supplied with the first and second detection signals for stopping the output of the constant-voltage constant-current circuit when either the first or second detection signal exceeds a second threshold level. Also provided is a protection circuit supplied with the first and second detection signals for cutting off the electric path that connects the constant-voltage constant-current circuit to the secondary battery when either the first or second detection signals exceeds a third threshold level.

7 Claims, 10 Drawing Sheets

CHARGING CONTROL METHOD AND CHARGING CONTROL DEVICE

BACKGROUND OF THE INVENTION

1. Field of the Invention

The present invention relates to a charging control method and charging control device and is suitably applied to a charging control method and charging control device for charging a secondary battery of a battery pack by means of a charging device comprising a constant-voltage constant-current circuit for example.

2. Description of the Related Art

In recent years, in the portable electronic product field such as a portable telephone and a camera built-in VTR, a secondary battery (e.g., lithium ion battery) is used as an electric source. These portable electronic products are equipped with a battery pack to store a high capacity secondary battery, and by using this battery pack as an electric source, the user can use these portable electronic products on the road.

Accordingly, in the case of using these portable electronic products, first of all it is necessary to charge the secondary battery prior to using these gears. When charging the secondary battery, if voltage and current larger than the rated value are supplied to the secondary battery, there is a fear of causing damage to said secondary battery. Thus, the charging device generally comprises a constant-voltage constant-current circuit so that the output voltage and output current larger than the rated value would not be given to the secondary battery.

Furthermore, a protection circuit is provided in the battery pack in order to prevent overcharge to the secondary battery when charging, or over-discharge from the secondary battery when discharging, and in the case where the over-charged state or the over-discharged state is detected based on the voltage value of the secondary battery, the electric path of the secondary battery is cut off and the secondary battery is protected.

At this point, a charging control method for charging the secondary battery stored in the battery pack by using said charging device is shown in FIG. 1. A charging unit 1 and a battery pack 2 are electrically connected via connecting terminals T1, T2 and start charging the secondary battery BT of the battery pack 2.

The charging unit 1 comprises a constant-voltage constant-current circuit 3 and supplies output current lower than the rated value and output voltage lower than the rated value to the secondary battery BT of the battery pack 2 by using the input voltage and the input current from the AC adapter (not shown in Figure) connected as a DC source via input terminals A and B.

In this case, the charging unit 1 supplies the output current lower than the rated value (lower than 1 coulomb) and the output voltage (reference charging voltage 4.2 volts) to the secondary battery BT and does not supply the output voltage and the output current larger than the rated value by controlling the output voltage and the output current of the constant-voltage constant-current circuit 3 by the constant-voltage constant-current control circuit 4.

More specifically, when the DC power source having the nonconforming output voltage and the output current are supplied via input terminals A and B, the input current and input voltage more than the rated value are supplied to the constant-voltage constant-current circuit 3, and as a result, heat more than the rated value is generated at the constant-voltage constant-current circuit 3 and said constant-voltage constant-current circuit 3 should be damaged. In order to prevent such damage of the constant-voltage constant-current circuit 3, the constant-voltage constant-current control circuit 4 controls the output voltage and the output current of the constant-voltage constant-current circuit 3 thus preventing the damage of said constant-voltage constant-current circuit 3.

In practice, the constant-voltage constant-current control circuit 4 is equipped with a voltage detection circuit 6 for detecting the voltage value of the output voltage to be supplied by the constant-voltage constant-current circuit 3 and outputs the voltage detection result to the control circuit 7. Moreover, in the constant-voltage constant-current control circuit 4, a current detection circuit 8 for detecting current value of the input current to be supplied by the DC power source is provided between the input terminal B and the cathode of the secondary battery BT and this circuit transmits the current detection result to the control circuit 7. The control circuit 7 stops the output of the constant-voltage constant-current circuit 3 in the case where the voltage detection result is larger than the predetermined rated voltage value, and it also stops the output of the constant-voltage constant-current circuit 3 in the case where the current detection result is larger than the predetermined rated current value.

On the other hand, a protection circuit is provided in the battery pack in order to prevent overcharge to the secondary battery BT when charging, and also a voltage detection circuit 10 for detecting the voltage value of the secondary battery BT, and a current detection circuit 11 for detecting the direction of current flowing in the electric path based on the detection of current value to be supplied to the secondary battery BT and the voltage difference between two terminals of a resistance element are provided in this battery pack 2.

In the case where the voltage detection result from the voltage detection circuit 10 shows the overcharged condition or over-discharged condition, the protection circuit 9, by turning the switching circuit 13 in OFF condition by the control circuit 12, cuts off the electric path of the battery pack 2 and stops the charging and discharging of the secondary battery BT. Thus, in the battery pack 2, the secondary battery BT is prevented from the damage by the protection circuit 9.

However, in the charging unit 1 and the battery pack 2, by setting the threshold voltage of the voltage detection circuit 6 of the charging unit 1 to become lower than the threshold value of the voltage detection circuit 10 of the battery pack 2, its output is stopped before the protection circuit 9 of the battery pack 2 when the constant-voltage constant-current circuit 3 outputs over-voltage and over-current.

In this case, as shown in FIG. 2, the reference charging voltage which the charging unit 1 supplies to the battery pack is 4.2 volts, and the detection result of the voltage detection circuit 6 at this point becomes the detection voltage range V1 (4.15–4.25 volts) including the dispersion feature (±0.05 volts) of the detection circuit. Moreover, the overcharged voltage with which the protection circuit 9 of the battery pack 2 operates is 4.35 volts and the detection result of the voltage detection circuit 10 becomes the detected voltage range V2 (4.30–4.40 volts) including the dispersion feature (±0.05 volts) of the detection circuit.

Accordingly, if the detection result of the voltage detection circuit 6 is within the voltage range V1 (4.15–4.25 volts) in the charging unit 1, charging should be continued as it is, but if the detection result is beyond the range of the detection voltage V1, the output of the constant-voltage constant-current circuit 3 should be stopped by the constant-voltage constant-current control circuit 4. However, in the case where the over-voltage of the detection voltage range V2 (4.30–4.40 volts) is supplied to the secondary battery BT of the battery pack due to the failure of the constant-voltage constant-current circuit 3 or the constant-voltage constant-current control circuit 4 while charging by the charging unit 1, the battery pack 2 cuts off the electric path by turning off the switching circuit 13 by the protection circuit 9 and protects the secondary battery BT.

Thus, since the voltage detection range V1 (4.15–4.25 volts) of the voltage detection circuit 6 in the charging unit 1 and the voltage detection range V2 (4.30–4.40 volts) of the voltage detection circuit 10 in the battery pack 2 are different each other, the charging unit 1 stops the output of the constant-voltage constant-current circuit 3 before the protection circuit 9 of the battery pack starts operating, smooth charging control could not be conducted before.

Accordingly, when the voltage detection circuit 6 of the charging unit 1 cannot function properly because the detection voltage range V2 (4.30–4.40 volts) with which the protection circuit of the battery pack 2 operates is higher than that of the charging unit 1, it causes a problem that the secondary battery BT should have the safety feature capable of resisting the overcharged condition (4.40 volts) corresponding to the detection voltage range V2 (4.30–4.40 volts) with which the protection circuit 9 works.

Furthermore, in this case since in the battery pack 2, the detection voltage range V2 (4.30–4.40 volts) with which the protection circuit 9 works is higher than in the charging unit 1, the sudden breakdown of the secondary battery BT could not be prevented in the case where the protection circuit 9 could not operate correctly.

SUMMARY OF THE INVENTION

In view of the foregoing, an object of this invention is to provide a charging control method and charging control device capable of controlling the secondary battery safely when charging it.

The foregoing object and other objects of the invention have been achieved by the provision of a charging control device of a secondary battery for connecting a charging unit which outputs constant-voltage and constant-current, and a battery unit which comprises said secondary battery via connecting terminals, and for charging said secondary battery by said charging unit; wherein said charging unit comprising: a constant-voltage constant-current circuit for supplying an output having the fixed voltage and the fixed current, and a first voltage detection circuit for comparing the output voltage from said constant-voltage constant-current circuit with a first threshold level, and generating a first detection signal corresponding to said comparison result; said battery unit comprising: said secondary battery to be charged with the output of said constant-voltage constant-current circuit, and a second voltage detection circuit for comparing the charging voltage of said secondary battery with said first threshold level, and generating a second detection signal corresponding to said comparison result; and said charging unit further comprising: an output control circuit for being supplied said first and second detection signals from said first and second detection circuits respectively, and for stopping output of said constant-voltage constant-current circuit when either said first or second detection signal exceeds a second threshold level.

Said battery unit further comprising: a protection circuit for being supplied said first and second detection signals from said first and second detection circuits respectively, and cutting off the electric path for supplying the output of said constant-voltage constant-current circuit to said secondary battery, when either said first or second detection signal exceeds a third threshold level.

Thus, the output voltage or the output current of the constant-voltage constant-current circuit is stopped based on either the first or the second detection signal, and when the output voltage or the output current of said constant-voltage constant-current circuit becomes too high and uncontrollable, by cutting off the electric path of the secondary battery and protecting said secondary battery, the charging control having double safety not supplying over-voltage or over-current to the secondary battery can be conducted.

In the charging control device which electrically connects a charging unit and a battery device via connecting terminals and charges the secondary battery of the battery device by the charging unit, we provide the first detection means for detecting output voltage or output current of the constant-voltage constant-current means when the fixed voltage and the fixed current are supplied to the secondary battery by the constant-voltage constant-current means of the charging unit, the second detection means for detecting charging voltage or charging current of the secondary battery, the control means for stopping output of the constant-voltage constant-current means when either the first or the second detection result to be transmitted from the first and the second detection means respectively exceeds the first threshold level, and protection means for cutting off the electric path of the secondary battery when either the first or the second detection result exceeds the second threshold level that is set higher than the first threshold level and for protecting said secondary battery.

The nature, principle and utility of the invention will become more apparent from the following detailed description when read in conjunction with the accompanying drawings in which like parts are designated by like reference numerals or characters.

DETAILED DESCRIPTION OF THE EMBODIMENT

Preferred embodiments of the present invention will be described with reference to the accompanying drawings:

(1) The First Embodiment

Figure 1:
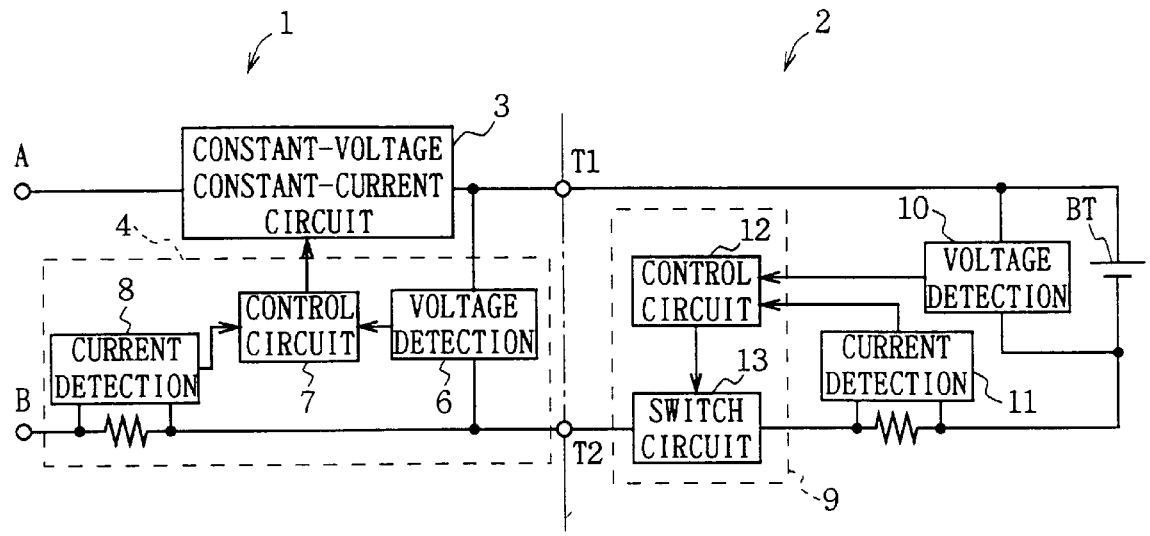
FIG. 1 is a block diagram showing the construction of a conventional charging device and battery pack.
Figure 2:
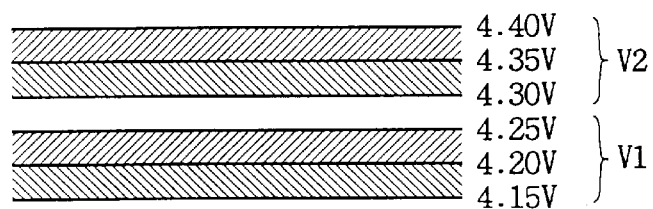
FIG. 2 is a brief linear diagram showing the voltage detection range.
Figure 3:
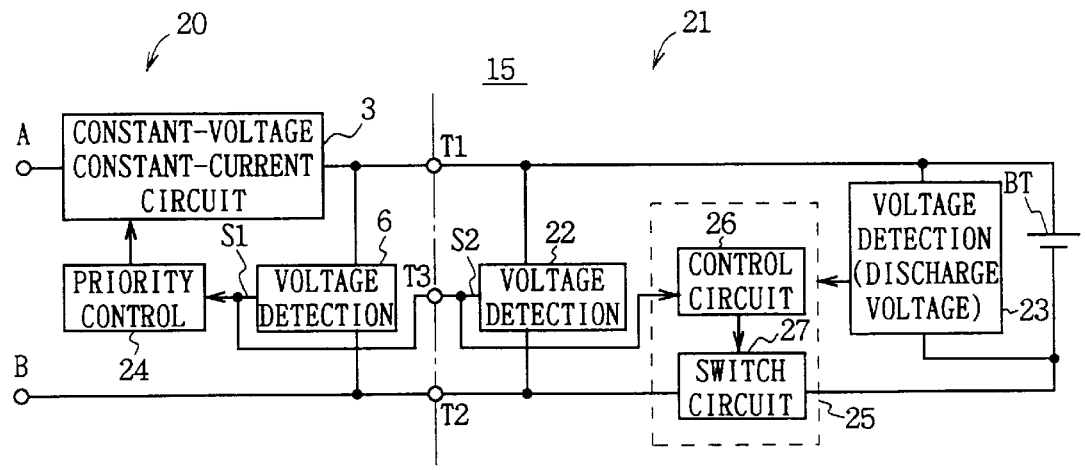
FIG. 3 is a block diagram showing the construction of a charge control device according to the first embodiment of the present invention.

In FIG. 3, in which the corresponding parts of FIG. 1 are given the same reference numerals, 15 generally shows a charging control device and this starts charging the secondary battery BT of the battery pack 21 by electrically connecting the charging unit 20 and the battery pack 21 via connecting terminals T1 and T2. In the case of this embodiment of the present invention, since the case of conducting the charging control by the voltage value is explained as an example, an explanation on the current detection circuit is omitted.

The charging unit 20 supplies output voltage and output current lower than the rated value from the constant-voltage constant-current circuit 3 to the secondary battery BT of the battery pack 21. The voltage detection circuit 6 detects output voltage put out from the constant-voltage constant-current circuit 3, and outputs a detection signal S1. The detection signal S1 is supplied to the priority control circuit 24 and the protection circuit 25 of the battery pack 21. The threshold voltage of the voltage detection circuit 6 is set to the reference charging voltage 4.2 volts and as the detection characteristic, there exists ±0.05 volts dispersion at the detection time.

The voltage detection circuit 22 of the battery pack 21 detects charged voltage of the secondary battery BT charged, and outputs the detection signal S2. The detection signal S2 is supplied to the priority control circuit 24 via the connecting terminal T3 and to the control circuit 26 of the protection circuit 25. The voltage detection circuit 22 is the same detection circuit as the voltage detection circuit 6, and its threshold voltage is also set to the reference charging voltage 4.2 volts and as a detection characteristic, the ±0.05 volts dispersion exists at the detection time.

In this case, the priority control circuit 24 controls the output voltage of the constant-voltage constant-current circuit 3 based on the detection signal S1 or S2 transmitted first from the voltage detection circuit 6 and 22 (the signal arrived first) and if the detection signal S1 or S2 at this point is within the range of detection voltage range V1 (4.15–4.25 volts), it supplies the output voltage with the voltage value as it is.

Furthermore, when the signal level of the detection signal S1 or S2 exceeds the first threshold level, the priority control circuit 24 stops supply of the output voltage and the output current because the constant-voltage constant-current circuit 3 cannot be controlled properly. Moreover, in the case where the supply of the output voltage and the output current cannot be stopped due to the failure of the constant-voltage constant-current circuit 3, when the signal level of the detection signal S1 or S2 exceeds the second threshold level, the control circuit 26 of the protection circuit 25 cuts off the electric path by setting the switching circuit 27 in the OFF condition so as to protect the secondary battery BT.

In this case, the signal level of the detection signal S1 or S2 when the protection circuit 25 works is set lower than the voltage level when the conventional protection circuit 9 operates under the overcharged condition of the detection voltage range V2 (4.30–4.40 volts) and thus the electric path of the secondary battery can be shut down when the voltage level is low, and thereby the safety of the secondary battery BT can be increased.

The voltage detection circuit 23 for over-discharge detecting is provided in the battery pack 21 and when said voltage detection circuit 23 detects the over-discharge condition, transmits the detection result to the control circuit 26 and putting the switching circuit 27 in the OFF condition, prevents the over-discharge of the secondary battery BT by shutting down the electric path of the battery pack 21.

Figure 4:
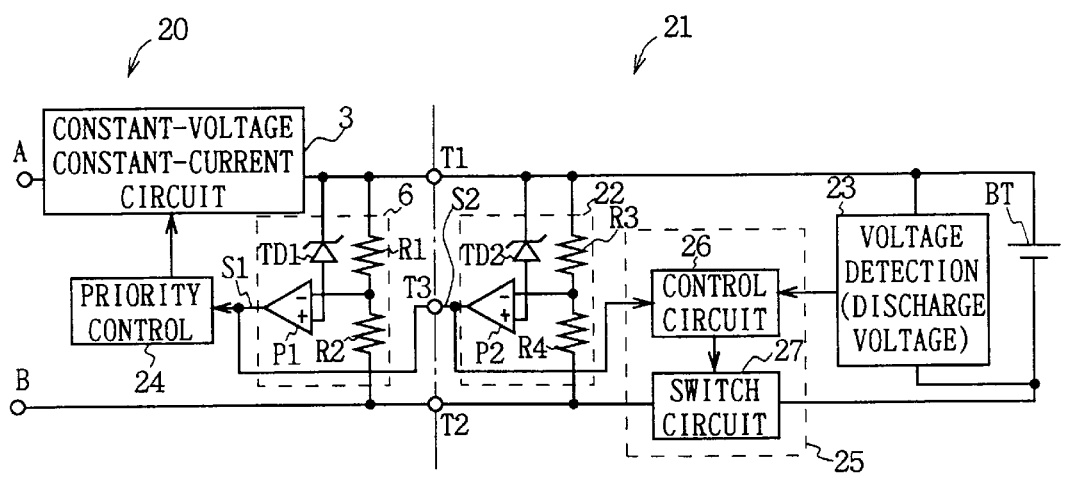
FIG. 4 is a block diagram showing the construction of a voltage detection circuit.

In FIG. 4, in which the corresponding parts of FIG. 3 are given the same reference numerals, shows the construction of voltage detection circuits 6 and 22. Since the circuit construction of the voltage detection circuit 6 and the voltage detection circuit 22 are the completely same in this case, only the voltage detection circuit 6 is explained below.

In the voltage detection circuit 6, resistances R1 and R2 for detecting the output voltage from the constant-voltage constant-current circuit 3 are provided between input terminals A and B, and one end of the resistance R1 is connected to the output terminal of the constant-voltage constant-current circuit 3 while the other end is connected to the input terminal B via the resistance R2.

The mid-point potential of these resistances R1 and R2 is the voltage which the output voltage from the constant-voltage constant-current circuit 3 is divided and supplied to the inversed input terminal of the comparator P1. The comparator P1 compares the output voltage exceeding the reference voltage of the Zener diode TD1 and the mid-point potential of resistances R1 and R2 and when the output voltage from the constant-voltage constant-current circuit 3 exceeds the voltage level of the mid-point potential, outputs the detection signal S1 of which the current level suddenly increases with the increase of voltage. More specifically, the voltage detection circuit 6 transmits the detection signal Si when the output voltage from the constant-voltage constant-current circuit 3 exceeds 4.2 volts.

Figure 5:
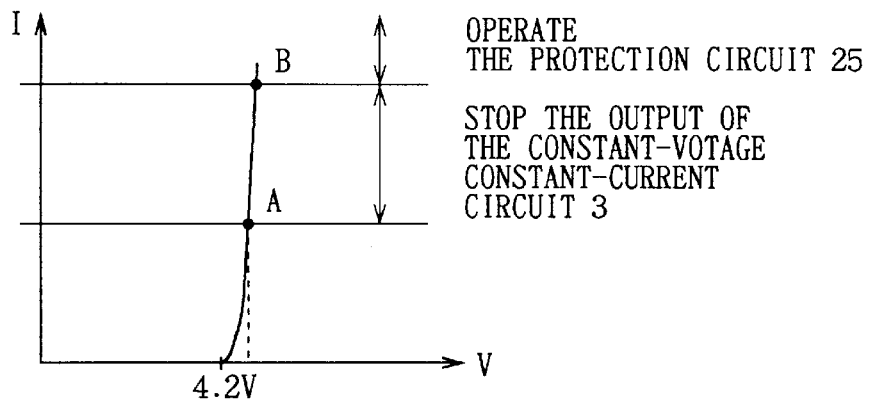
FIG. 5 is a graph illustrating a charge control method according to the current level of detection signal.

For example, as shown in FIG. 5, the detection signal S1 is the signal of which the current capacity suddenly increases when the output voltage from the constant-voltage constant-current circuit 3 exceeds the reference charging voltage (4.2 volts), and the priority control circuit 24 uses this detection signal S1 as a control signal when controlling the output of the constant-voltage constant-current circuit 3 and in the control circuit 26 of the protection circuit 25, this detection signal S1 is used as the control signal to control the switching circuit 27.

When the input detection signal S1 or S2 is lower than the signal level shown by the point A, the priority control circuit 24 of the charging unit 20 controls the output voltage of the constant-voltage constant-current circuit 3, and when the input detection signal S1 or S2 exceeds the point A, it stops the output of the constant-voltage constant-current circuit 3, and when the detection signal S1 or S2 exceeds the signal level shown by the point B, the switching circuit 27 is set in OFF condition and the electric path is shut down by the protection circuit 25 of the battery pack 21.

Accordingly, since the priority control circuit 24 can stop output voltage of the constant-voltage constant-current circuit 3 at the stage on which the current level of the detection signal S1 or S2 is low (the point A), it stops preferentially the charging before the protection circuit 25 of the battery back 21 stops.

Since the detection signals S1 and S2 to be supplied from the voltage detection circuits 6 and 22 respectively have the dispersion of ±0.05 volts, there are cases where the detection results differ although these are completely the same detection circuits. Even in such cases, the priority control circuit 24 controls the output voltage of the constant-voltage constant-current circuit 3 based on the detection signal S1 or S2 arrived first from the voltage detection circuit 6 and 22, and thus, this priority control circuit 24 is capable of controlling the output voltage based on either the detection signal S1 or S2 constantly.

According to the foregoing construction, when the charging unit 20 and the battery pack 21 in the charging control device 15 are connected via connecting terminals T1, T2 and T3, the voltage detection circuits 6 and 22 having the same detection characteristics are connected via the connecting terminal T3 each other. Thus, the charging unit 20 can input either the detection signal S1 or S2 transmitted first from the voltage detection circuits 6 and 22 into the priority control circuit 24.

Accordingly, since the priority control circuit 24 controls the output voltage of the constant-voltage constant-current circuit 3 based on either the detection signal S1 or S2 which arrived first, the charging unit 20 can eliminate the inconvenience of the charging unit 20 and the battery pack 21 conducting the charging control independently when the voltage detection circuits 6 and 22 are not connected each other and thus, the charging control can be conducted smoothly.

Furthermore, since in the charging unit 20, when the detection result exceeds the low current level (the point A) of the detection signal S1 or S2 which rises suddenly when it exceeds 4.2 volts, the output of the constant-voltage constant-current circuit 3 is stopped, while in the battery pack 21, when the detection signal S1 or S2 exceeds the high current level (the point B), the protection circuit 25 is operated, the priority control can be conducted in order of the constant-voltage constant-current circuit 3 and the protection circuit 25 based on the detection signal S1 or S2 which has almost no voltage change between the point A and the point B but has large current level changes.

As a result, since in the battery pack 21, the operating voltage (V) by which the protection circuit 25 works becomes only a little higher than the reference charging voltage 4.2 volts (the point B), the safety to impart to the secondary battery BT can be set to the low voltage value and the safety of the secondary battery BT can be further improved.

In the battery pack 2, since the protection circuit 25 is arranged to operate when the detection result exceeds the current level of the detection signals S1 and S2 (the point B), even when the charging is conducted by the charger other than the exclusive charging unit 20 for example, the control circuit 26 can turn the switching circuit 27 OFF when it exceeds the current level of the detection signal S2 detected by the voltage detection circuit 22 (the point B) and thus, the electric path can be shut down when the voltage level is low before it becomes overcharged condition and thus, the secondary battery BT of the battery pack 21 can be safely protected.

According to the foregoing construction, since the charging unit 20 captures the detection signal S2 to be transmitted from the voltage detection circuit 22 for detecting the voltage value of the secondary battery BT and the detection signal S1 to be transmitted from the voltage detection circuit 6 for detecting the output voltage of the constant-voltage constant-current circuit 3 into the priority control circuit 24 and stops the output voltage of the constant-voltage constant-current circuit 3 based on the low current level (the point A) of either the detection signal S1 or S2 arrived first and operates the protection circuit 25 based on the high current level (the point B), the priority control can be conducted in order of the charging unit 20 and the battery pack 21, and thus, the secondary battery BT can be safely charged.

(2) The Second Embodiment

Then, in the second embodiment, the control method to protect the secondary battery BT by the protection circuit 25 of the battery pack 21 not using the priority control circuit 24 which was used in the first embodiment when the output voltage of the constant-voltage constant-current circuit 3 cannot be controlled correctly by the charging unit 31 is described.

Figure 6:
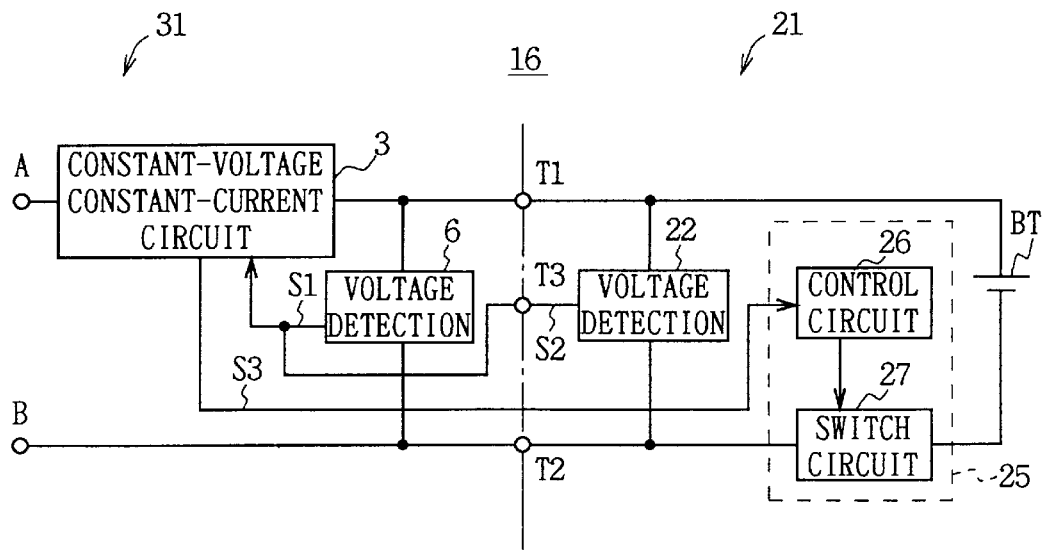
FIG. 6 is a block diagram showing the construction of a charge control device according to the second embodiment of the present invention.

In FIG. 6, in which the corresponding parts of FIG. 3 are given the same reference numerals, 16 generally shows a charging control device and in the charging unit 31, firstly, the output from the constant-voltage constant-current circuit 3 is stopped based on either the detection signal S1 or S2 arrived first from the voltage detection circuits 6 and 22 and when the constant-voltage constant current circuit 3 no longer works correctly, the control circuit 26 of the protection circuit 25 sets the switching circuit 27 in the OFF condition based on the control signal S3 supplied from the constant-voltage constant-current circuit 3 and protects the secondary battery BT.

Figure 7:
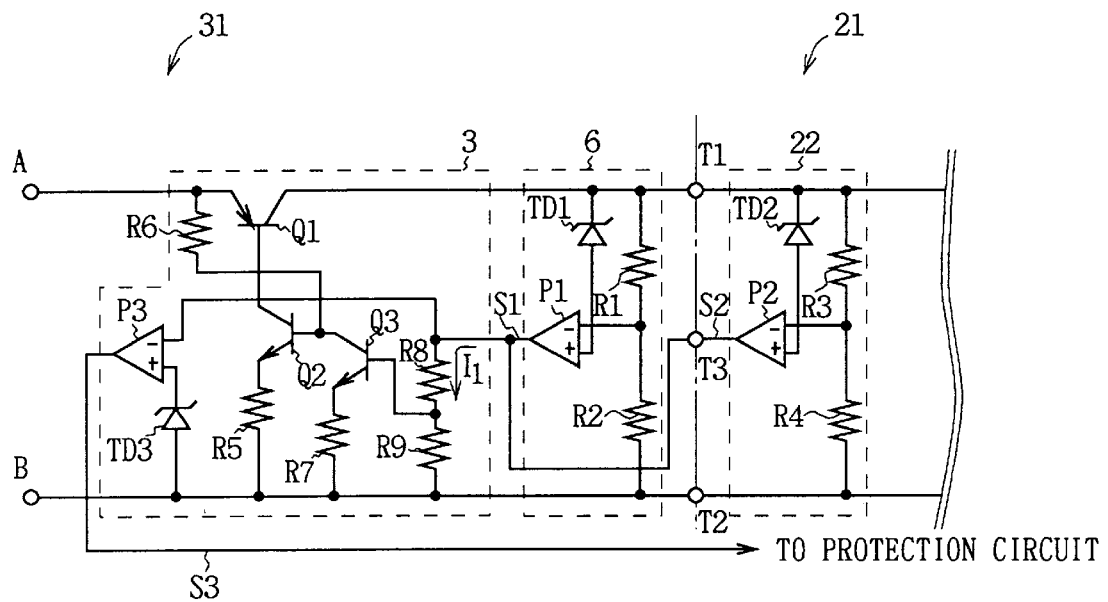
FIG. 7 is a block diagram showing the construction of a constant-voltage constant-current circuit.

Referring next to FIG. 7 in which parts corresponding to those in FIG. 4 are designated the same reference numerals, the circuit construction of the constant-voltage constant-current circuit 3 of the charging unit 31 is explained. Since in this case, the circuit constructions of the voltage detection circuits 5 and 22 are the same as those in FIG. 4, explanations are omitted at this point. The constant-voltage constant-current circuit 3 is connected to an emitter of the transistor Q1 as a switch element at the input side and the collector of this transistor Q1 is connected to the output side of the constant-voltage constant-current circuit 3 and the base is connected to the collector of the transistor Q2.

The emitter of the transistor Q2 is grounded via resistance R5, and the base is connected to the collector of the transistor Q3, as a control element as well as being connected to the emitter of the transistor Q1 via resistance R6. The emitter of the transistor Q3 is grounded via resistance R7 and the base is connected to the connecting mid-point of resistances R8 and R9. In this case, the output from the comparator P1 of the voltage detection circuit 6 is voltage divided by the resistances R8 and R9, and is supplied to the base of the transistor Q3 as bias.

Outputs from the comparator PI of the voltage detection circuit 6 and the comparator P2 of the voltage detection circuit 22 are supplied to the inverted input terminal of the comparator P3, and this comparator P3 is grounded at the non-inverted input terminal via Zener diode TD3 and transmits the comparison output (control signal S3) to the control circuit 26 of the protection circuit 25 (FIG. 6).

When the DC electric source is supplied from the AC adapter to the constant-voltage constant-current circuit 3 via input terminals A and B, this circuit becomes ON condition because the bias current is supplied to the base of the transistor Q2 via the resistance R6 and accordingly the transistor Q1 becomes ON and operable. At this point, since the output voltage of the constant-voltage constant-current circuit 3 is lower than the reference value of the Zener diode TD1, the comparator P1 of the voltage detection circuit 6 should not output the detection signal S1. Accordingly, the transistor Q3 should not become ON.

Then, the secondary battery BT of the battery pack 21 is charged and when the voltage level to be sent out from the collector of the transistor Q1 exceeds the reference value of the Zener diode TD1 of the voltage detection circuit 6, the comparator P1 transmits the detection signal S1 of which the current level suddenly rises as compared with the increase of the voltage level. And since the detection signal S1 is voltage divided by resistances R8 and R9 and given to the base of the transistor Q3, the transistor Q3 becomes ON.

Accordingly, since the base current of the transistor Q2 is drawn toward the collector side of the transistor Q3, the transistor Q2 becomes OFF, and as a result, also the transistor Q1 becomes OFF, Accordingly, since the supply of output voltage from the collector of the transistor Q1 is suspended and the detection signal S1 of the comparator P1 would not be sent out again, the transistor Q3 becomes OFF and transistors Q2 and Q1 become ON again. By repeating such processings, the constant-voltage constant-current circuit 3 can supply the output voltage 4.2 volts that is the fixed reference charging voltage, to the secondary battery BT.

If the transistor Q3 as the control element does not properly function due to the failure when transistors Q2 and Q1 are in ON conditions and the constant-voltage constant-current circuit 3 cannot turn the transistors Q2 and Q1 in OFF condition, the over-voltage should be supplied. At this point, the signal level of the detection signal S1 supplied to the inverted input terminal of the comparator P3 exceeds the reference value of the Zener diode TD3, and as a result, the comparator P3 outputs the control signal S3 to the protection circuit 25.

More specifically, as shown in FIG. 5, the signal level of the detection signal S1 or S2 suddenly rises when it exceeds the threshold voltage (4.2 volts) of the voltage detection circuit, and if the signal level of the detection signal S1 or S2 is within the range up to the point A, the output voltage of the constant-voltage constant-current circuit 3 can be controlled and supplied. However, if the signal level exceeds the current level of the point A, the output of the constant-voltage constant-current circuit 3 is stopped and when it exceeds the current level of the point B (the reference value of Zener diode TD3), control signal S3 is transmitted from the comparator P3 to the protection circuit 25.

In the battery pack 21, if the signal level of the detection signal S1 or S2 exceeds the reference value of Zener diode TD3 connected to the comparator P3, the protection circuit 25 shuts down the electric path and protects the secondary battery BT.

According to the foregoing construction, in the charging control device 16 in the second embodiment, detection signals Si and S2 to be transmitted from the voltage detection circuits 6 and 22 are captured directly by the constant-voltage constant-current circuit 3, and the fixed output voltage is supplied to the secondary battery BT when the current level of either the detection signal S1 or S2 arrived first is lower than the predetermined level (the point A), and when the current level is larger than the predetermined level (the point B), the electric path is shut down by the protection circuit 25 and thus, the secondary battery BT is protected.

Accordingly, since in the charging unit 31, the output voltage of the constant-voltage constant-current circuit 3 is stopped first preferentially based on the detection signal S1 or S2 transmitted first from voltage detection circuits 6 and 22 not providing the priority control circuit 24 (FIGS. 3 and 4) and when the stop operation can no longer work properly, the protection circuit 25 is to operate in the battery pack 21, the priority control based on changes of the current level of the detection signal S1 or S2 can be conducted with the simple construction.

According to the foregoing construction, in the charging control device 16, the charging unit 31 detects output voltage to be supplied from the constant-voltage constant current circuit 3 by the voltage detection circuits 6 and 22 having the same threshold voltage respectively and stops the output voltage of the constant-voltage constant-current circuit 3 based on either the detection signal S1 or S2 transmitted first, and since the secondary battery BT of the battery pack 21 is protected based on the control signal S3 transmitted from the constant-voltage constant-current circuit 3 when the stop operation can not work properly, the priority control based on the current level changes of the detection signal S1 or S2 can be conducted in order of the charging unit 31 and the battery pack 21, and thereby the secondary battery BT can be charged safely with the simple construction.

(3) The Third Embodiment

Firstly, the conventional general charging control method is explained before going into the explanation of the charging control method of the third embodiment.

In the conventional charging unit, when the output voltage of 4.2 volts, that is the reference charging voltage, is supplied from the constant-voltage constant-current circuit and recharged, the charging voltage of the secondary battery BT reaches to 4.2 volts shortly.

At this point, the charging unit temporarily stops the supply of the output voltage from the constant-voltage constant-current circuit, however, when the supply of the output voltage is stopped, the charged voltage of the secondary battery becomes lower than 4.2 volts. More specifically, in this case the secondary battery BT has not been completely charged.

Accordingly, the constant-voltage constant-current circuit supplies the output voltage of 4.2 volts reference charging voltage to the secondary battery BT again and stops the supply of output voltage when the charged voltage of the secondary battery BT reaches to 4.2 volts again. Accordingly, in the charging unit, by repeating the supply and suspension of the output voltage from the constant-voltage constant-current circuit as described above, the fixed output voltage is supplied to the secondary battery BT, and when the charged voltage of the secondary battery BT cannot fall down below 4.2 volts because the supply of output voltage is stopped, the charging processing is terminated assuming that the secondary battery BT has been completely charged.

However, in the conventional charging control method in the charging unit, the secondary battery BT is charged by the constant-voltage constant-current circuit supplying the output voltage of 4.2 volts reference charging voltage. However, since the charging was constantly conducted by the output voltage of 4.2 volts, the time required for charging became longer.

To obviate such problems according to the third embodiment, the secondary battery BT is charged by the output voltage of 4.3 volts when the charging voltage of the secondary battery BT is lower than 4.2 volts and the secondary battery BT is charged by the normal output voltage of 4.2 volts reference charging voltage when the charging voltage of the secondary battery BT exceeds 4.3 volts, the secondary battery BT can be charged in a short period of time.

Figure 8:
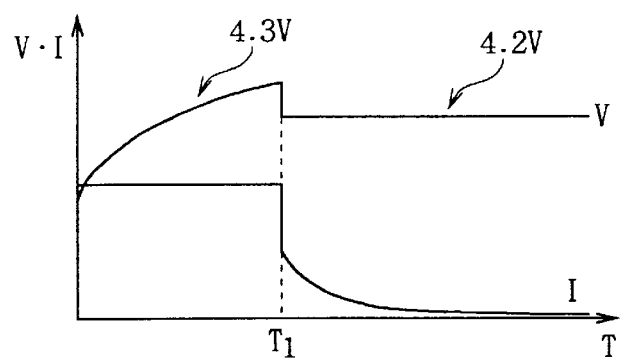
FIG. 8 is a graph showing the voltage level and the current level.

In this case, as shown in FIG. 8, the output voltage V is increased up to the predetermined time $T_1$ and when the charging voltage of the secondary battery BT exceeds 4.3 volts, the output voltage of 4.2 volts is constantly supplied. The current level of output current I changes according to the output voltage V and its current level gradually drops after the time $T_1$. Thus, accordingly to the third embodiment, by combining the output voltage of 4.3 volts and the output voltage of 4.2 volts, the charging can be conducted in the shorter period of time as compared with the conventional charging method by which the output voltage of 4.2 volts is constantly supplied.

Figure 9:
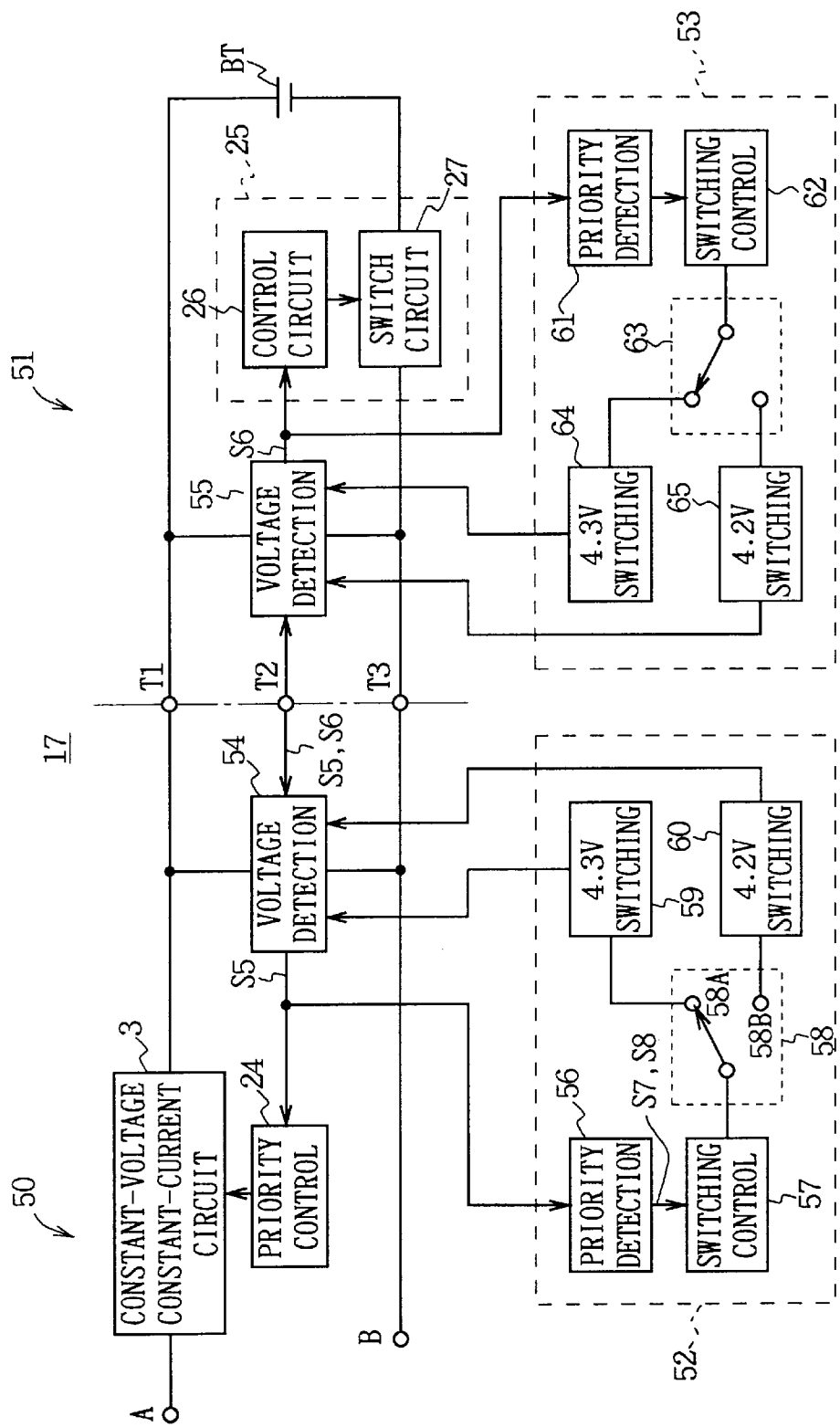
FIG. 9 is a block diagram showing the construction of a charge control device according to the third embodiment of the present invention.

In FIG. 9, in which the corresponding parts of FIG. 3 are given the same reference numerals, 17 generally shows a charging control device, and in the charging unit 50, a charging control circuit 52 is newly provided, and a charging control circuit 53 is provided connecting each other in the battery pack and voltage detection circuits 54 and 55 are provided in place of the voltage detection circuits 6 and 22 so that the threshold voltage can be switched between 4.2 volts and 4.3 volts.

Thus, the charging control circuits 52 and 53 can change threshold voltages of the voltage detection circuits 54 and 55 to the same voltage value (4.2 volts or 4.3 volts) based on either the detection signal S5 or S6 to be supplied first from the voltage detection circuits 54 and 55. With this arrangement, the priority control circuit 24 can control the output voltage of the charging unit 50 corresponding to the threshold voltage of the voltage detection circuits 54 and 55 and can send out the output voltage of 4.2 volts or 4.3 volts to the secondary battery BT.

In this case, the charging unit 50 charges the secondary battery BT by outputting the fixed output voltage (4.2 volts or 4.3 volts) from the constant-voltage constant-current circuit 3, but when the constant-voltage constant-current circuit 3 becomes incapable of working properly, the charging unit 50 stops the output based on the detection signal S5 or S6 supplied from the voltage detection circuit 54 or 55. However, when the supply of over-voltage cannot be stopped due the failure of the constant-voltage constant-current circuit 3, the charging unit 50 protects the secondary battery BT by breaking the electric path using the protection circuit 25 of the battery pack 51.

Since the charging control circuits 52 and 53 have the same circuit constructions, only the charging control circuit 52 is explained in the following. The charging control circuit 52 enters the detection signal S5 or S6 transmitted first from the voltage detection circuits 54 and 55 into the priority detection circuit 56. When the priority detection circuit 56 judges that the output voltage transmitted from the constant-voltage constant current circuit 3 is lower than 4.3 volts, outputs control signal S7 to the switching control circuit 57.

Practically, in case where the threshold voltage is set to 4.2 volts, when the output voltage to be transmitted from the constant-voltage constant-current circuit 3 exceeds 4.2 volts, the voltage detection circuits 54 and 55 output detection signals S5 and S6 of which the current level suddenly increase, and when the output voltage is lower than 4.2 volts, the voltage detection circuits 54 and 55 do not output detection signals S5 and S6. When the detection signal S5 or S6 is not supplied, the priority detection circuit 56 judges that the output voltage is lower than 4.2 volts and outputs the control signal S7 to the switching control circuit 57.

The switching control circuit 57 switches the connection terminal of the switch circuit 58 to the 58A side based on the control signal S7. Thus, a voltage switch circuit (4.3 volts) 59 switches the threshold voltage of the voltage detection circuit 54 to 4.3 volts. In this connection, the same processing is conducted in the charging control circuit 53 and simultaneously the threshold voltage of the voltage detection circuit 54 is shifted to 4.3 volts. Accordingly, the output voltage of the constant-voltage constant-current circuit 3 is increased up to the charging voltage of 4.3 volts and thus the secondary battery BT is charged by the output voltage of 4.3 volts.

As a result, when the voltage detection circuit 54 or 55 detects 4.3 volts, said voltage detection circuits 54 and 55 respectively supply the detection signals S5 and S6 to the priority detection circuit 56 of the charging control circuit 52. The priority detection circuit 56 outputs control signal S8 to the switching control circuit 57, based on either the detection signal S5 or S6 transmitted first.

The switching control circuit 57 shifts the connecting terminal of the switch circuit 58 to the 58B side based on the control signal S8. Then, the voltage switching circuit (4.2 volts) 60 switches the threshold voltage of the voltage detection circuit 54 to 4.2 volts. At this point, the same processing is conducted in the charging control circuit 53 and simultaneously, the threshold voltage of the voltage detection circuit 55 is switched to 4.2 volts. Thus, the secondary battery BT is charged by the output voltage of 4.2 volts.

Figure 10:
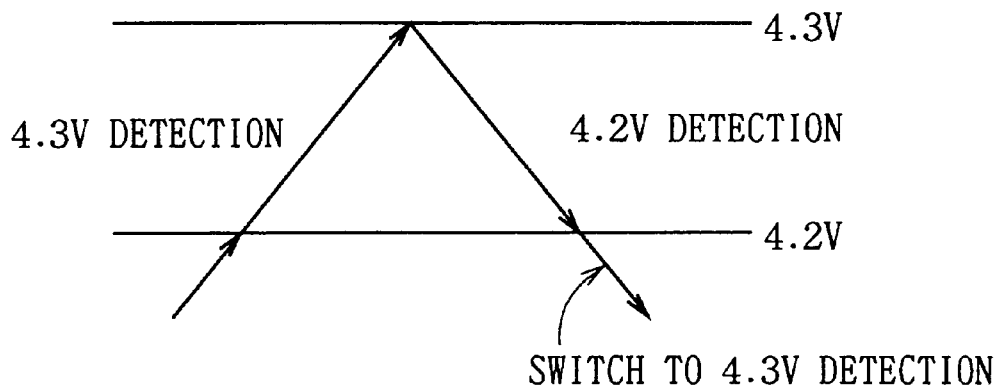
FIG. 10 is a graph illustrating switching control of the detection voltage.

More specifically, as shown in FIG. 10, in the charging control device 17 according to the third embodiment, when either one of detection voltages of two voltage detection circuits 54 and 55 respectively provided in the charging unit 50 and the battery pack 51 is lower than 4.2 volts, the threshold voltages of these two voltage detection circuits 54 and 55 are shifted to 4.3 volts, and the output voltage of 4.3 volts is supplied to the secondary battery BT from the constant-voltage constant-current circuit 3. When either one of detection voltages of two voltage detection circuits 54 and 55 exceeds 4.3 volts, the threshold voltages of two voltage detection circuits 54 and 55 are shifted to 4.2 volts, and the output voltage of 4.2 volts is supplied to the secondary battery BT.

In the charging control device 17, by switching the output voltage of the constant-voltage constant-current circuit 3 between 4.2 volts and 4.3 volts and changing the secondary battery BT using the output voltage of 4.3 volts and the output voltage of 4.2 volts, the time needed for charging can be shortened as compared with the conventional charging control method.

Figure 11:
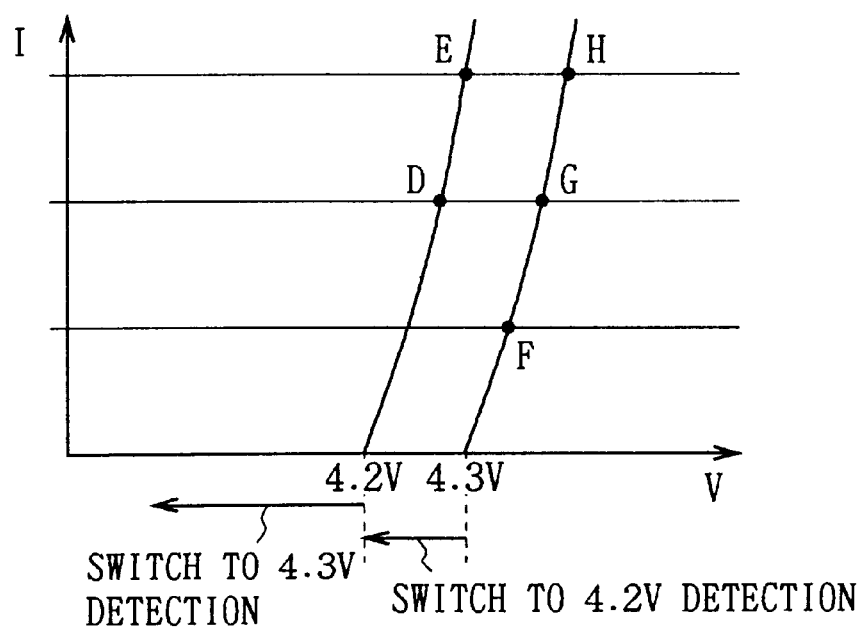
FIG. 11 is a graph illustrating order of the priority control.

In practice, as shown in FIG. 11, when signal levels of detection signals S5 and S6 of voltage detection circuits 54 and 55 are lower than 4.2 volts (the state in which no detection signals S5 or S6 is sent out), the charging control circuits 52 and 53 shift the detection voltage of the voltage detection circuits 54 and 55 to 4.3 volts in order to shorten the charging time.

When the detection voltages of the voltage detection circuits 54 and 55 are shifted to 4.3 volts, the volume of current of signal level of detection signals S5 and S6 to be sent out respectively from the voltage detection circuits 54 and 55 suddenly increases at the time point when the signal level exceeds 4.3 volts. At this point, if the detection signals S5 and S6 reach to the current level shown by the point F, the charging control circuits 52 and 53 shift the detection voltage to 4.2 volts.

However, in the case where the switching operation of the threshold voltage cannot be conducted properly at the time when the detection signals S5 and S6 are at the current level shown by the point F, the charging control circuit 52 and 53 stop the output voltage of 4.3 volts from the constant-voltage constant-current circuit 3 at the signal level shown by the point G. Furthermore, when the over-voltage is supplied due to the failure of the constant-voltage constant-current circuit 3, the protection circuit 25 of the battery pack 51 cuts off the electric path at the current level shown by the point H and thus, the secondary battery BT can be protected.

Furthermore, when the charging control circuits 52 and 53 switch the detection voltage of the voltage detection circuit 54 and 55 to 4.2 volts, the volume of current suddenly increases after the signal levels of the detection signals S5 and S6 exceed 4.2 volts. In this case, when the signal levels of the detection signals S5 and S6 reach to the point D exceeding 4.2 volts, the charging control circuits 52 and 53 stop the output voltage of 4.2 volts from the constant-voltage constant-current circuit 3.

Furthermore, in the case where the over-voltage is supplied due to the failure of the constant-voltage constant-current circuit 3, since the protection circuit 25 of the battery pack 51 cuts off the electric path when the current level is at the point E, the secondary battery BT can be protected.

More specifically, in this charging control device 17, firstly, by switch controlling the threshold voltage of the voltage detection circuits 54 and 55 and by stopping output voltage of the constant-voltage constant current circuit 3, and lastly, by protecting the secondary battery using the protection circuit 25, the secondary battery BT can be charged in a short period of time and the battery pack BT can be protected from overcharged condition even when the output voltage of the constant-voltage constant-current cannot be controlled.

Figure 12:
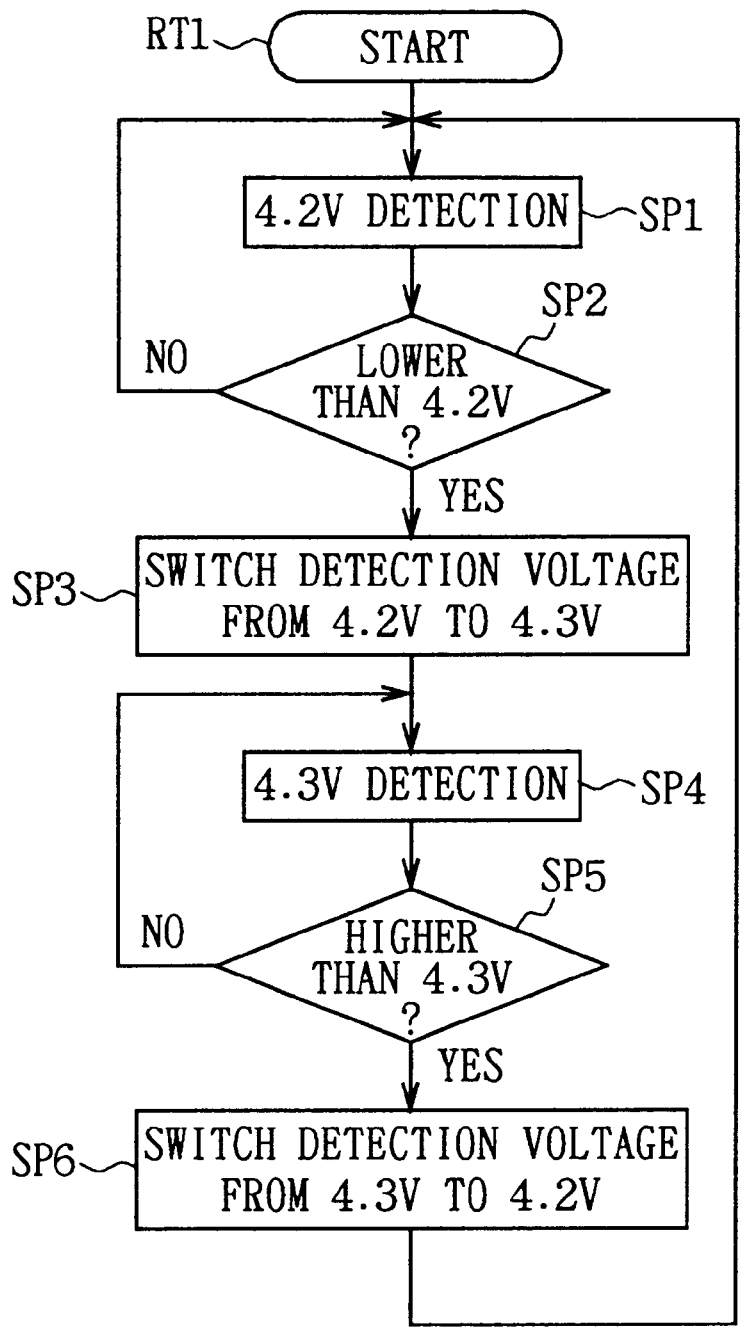
FIG. 12 is a flow chart showing the detection voltage switching processing procedure.

Then, firstly, the detection voltage switching processing procedure of the charging control circuit 52 (or 53) for switch controlling the threshold voltage of the voltage detection circuits 54 and 55 is explained with reference to a flow chart of FIG. 12. The charging control circuit 52 enters first from the start step RT1 and moves to the step SP1.

At the step SP1, the charging control circuit 52 is supplied with the detection signal S5 or S6 respectively detected by the voltage detection circuits 55 and 55 (threshold voltage 4.2 volts), and moves to the step SP2. At the step SP2, the charging control circuit 52 judges whether the threshold voltage is lower than 4.2 volts or not based on either the detection signal S5 or S7 arrived first.

At this point, if a negative result is obtained, this shows that the detection voltage exceeds 4.2 volts, and at this point, the charging control circuit 52, returning to the step SP1, conducts the voltage detection again. On the other hand, if an affirmative result is obtained, this shows that the detection voltage is lower than 4.2 volts, the charging control circuit 52 moves to the step SP3.

At the step SP3, in order to shorten the charging time the charging control circuit 52 switches the threshold voltage of the voltage detection circuits 54 and 55 to 4.3 volts and moves to the step SP4. At the step SP4, the constant-voltage constant-current circuit 3 supplies the output voltage of 4.3 volts to the secondary battery BT under the control of the priority control circuit 24. The charging control circuit 52 receives the detection signal S5 or S6 detected by the voltage detection circuits 54 and 55 (threshold voltage 4.3 volts).

At the step SP5, the charging control circuit 52 judges whether the detection voltage exceeds 4.3 volts or not based on either detection signal S5 or S6 arrived first from the voltage detection circuits 54 and 55.

At this point, if a negative result is obtained, this shows that the detection voltage is lower than 4.3 volts, and the priority control circuit 24 returns to the step SP4 and receives the detection signal S5 or S6 detected by the voltage detection circuits 54 and 55 (threshold voltage 4.3 volts) again. In this case, since the detection voltage does not exceed 4.3 volts, the priority control circuit 24 continues the supply of output voltage of 4.3 volts to the secondary battery BT. On the other hand, if an affirmative result is obtained, this shows the detection voltage exceeds 4.3 volts, and the charging control circuit 52 moves to the step SP6.

At the step SP6, the charging control circuit 52 switches the threshold voltage of voltage detection circuits 54 and 55 to 4.2 volts and charges the secondary battery BT with the reference charging voltage (4.2 volts) by means of the preference control circuit 24 and returns to the step SP1.

Thus, by repeating the processing described above, the charging control circuit 52 can supply the output voltage of 4.3 volts and the output voltage of 4.2 volts based on the detection signal S5 or S6 by means of the priority control circuit 24 and thus, the charging control circuit 52 can charge the secondary battery BT in a short period of time.

According to the foregoing construction, since in this charging control device 17, threshold voltages of the voltage detection circuits 54 and 55 are switched to 4.3 volts by the charging control circuits 52 and 53 when either the detection signal S5 or S6 transmitted first from the voltage detection circuits 54 and 55 is lower than 4.2 volts, the output voltage (4.3 volts) that is 0.1 volts higher than the reference charging voltage is supplied to the secondary battery BT from the constant-voltage constant-current circuit 3.

Then, when the detection voltage of either the detection signal S5 or S6 transmitted first from the voltage detection circuits 54 and 55 reaches to 4.3 volts, the threshold voltages of the voltage detection circuits 54 and 55 are switched to 4.2 volts by the charging control circuits 52 and 53, and the output voltage of 4.2 volts, that is the normal reference charging voltage, is supplied from the constant-voltage constant-current circuit 3. Thus, since the secondary battery BT is charged with the output voltage of 4.3 volts and the output voltage of 4.2 volts, the secondary battery BT can be charged in a short time.

Furthermore, in this charging control device 17, if the switching control cannot operate properly, the output of the constant-voltage constant-current circuit 3 is stopped based on either the detection signal S5 or S6 sent out from the voltage detection circuits 54 and 55 first. Moreover, in this charging control device 17, when the overcharged voltage is supplied due to the failure of the constant-voltage constant-current circuit 3, the electric path is shut down by the protection circuit 25 of the battery pack 51 and the secondary battery BT can be protected.

Thus, in this charging control device 17, switching of the detection voltage, suspension of the output of the constant-voltage constant-current circuit 3 and the cutoff of the electric path by the protection circuit 25 can be conducted in increasing order of the current levels (FIG. 11) according to the signal level change of the detection signal S5 or S6 transmitted first from the voltage detection circuits 54 and 55, and thereby the secondary battery can be recharged in a short time and safely.

According to the foregoing construction, since in this charging control device 17, by shifting the threshold voltage of the voltage detection circuits 54 and 55 from 4.3 volts to 4.2 volts, from 4.2 volts to 4.3 volts corresponding to the voltage value of the secondary battery, the output voltage of the constant-voltage constant-current circuit 3 can be adjusted and the secondary battery can be charged, and thereby the charging time of the secondary battery BT can be shortened. Moreover, in this charging control device 17, when the threshold voltage of the voltage detection circuits 54 and 55 cannot be switched correctly, the suspension of output of the constant-voltage constant-current circuit 3 according to changes of the current levels of the detection signal S5 or S6 and the operation to protect the secondary battery BT by the protection circuit 25 can be conducted, and thus, the secondary battery BT can be charged safely.

(4) Other Embodiments

The first to the third embodiments described above have dealt with the cases of detecting the output voltage of the constant-voltage constant-current circuit 3 by the voltage detection circuits 6 and 54 as the first detection means and for detecting the charging voltage of the secondary battery BT by the voltage detection circuits 22 and 55 as the second detection means and controlling the charging based on the current level of the detection signal S1 or S2. However, the present invention is not only limited to these but also the charging control may be conducted by using the current detection circuit in place of the voltage detection circuit. In this case, the same effect as those of the above can be obtained.

Figure 13:
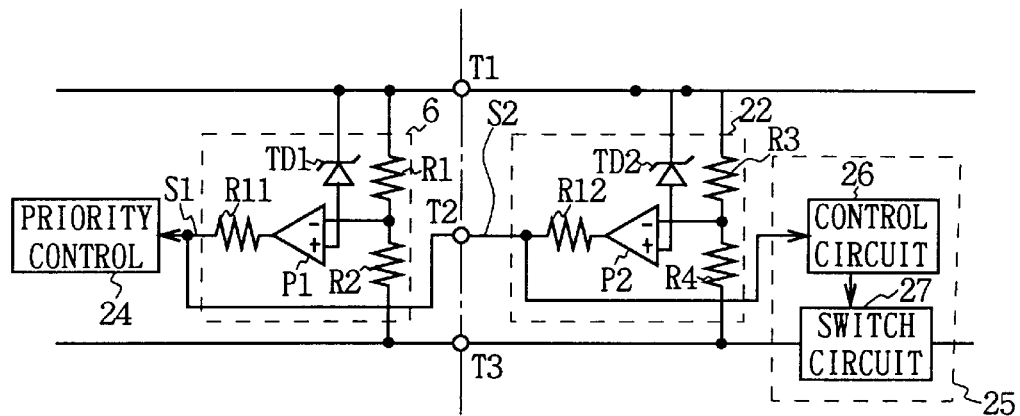
FIG. 13 is a block diagram showing the construction of voltage detection circuit according to the other embodiment.

Moreover, the first and the second embodiments described above have dealt with the case of using devices as shown in FIGS. 4 and 7 as the circuit construction. However, the present invention is not only limited to these but also high impedance elements such as resistances R11 and R12 may be provided at the output terminals of comparators P1 and P2 shown in FIG. 13. In this case, even though one of the voltage detection circuit 6 (or 22) is short-circuited and grounded, the detection signal S2 (or S1) from the voltage detection circuit 22 (or 6) can be transmitted to the priority control circuit 24, and thus, the priority control circuit 24 can control the charging based on the detection signal to be supplied from the other voltage detection circuit even if one of voltage detection circuits is out of order.

Figure 14:
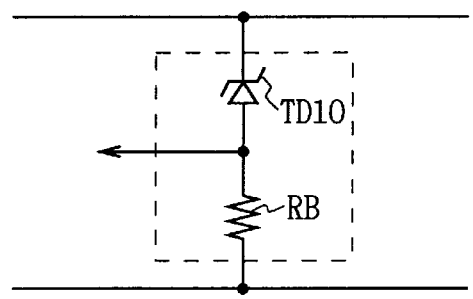
FIG. 14 is a block diagram showing the construction of voltage detection circuit according to the other embodiment.

Furthermore, the first and the second embodiments described above have dealt with the case of using comparators P1 and P2 as the circuit constructions of the voltage detection circuits 6 and 22. However, the present invention is not only limited to these, but also the voltage detection circuit may be formed with a Zener diode TD10 and a resistance R13 as shown in FIG. 14. In this case, when the output voltage from the constant-voltage constant-current circuit 3 exceeds the reference value (4.2 volts) of the Zener diode TD10, detection signal of which the current level suddenly rises is transmitted and the priority control based on the signal level of the detection signal can be conducted as in the case of the first and the second embodiments described above.

Figure 15:
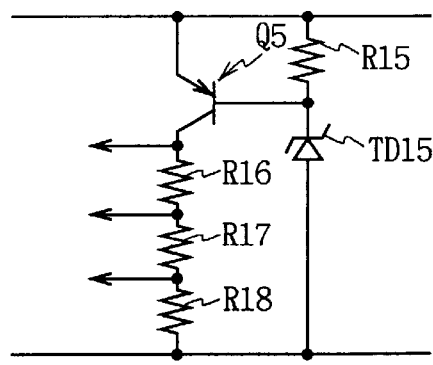
FIG. 15 is a block diagram showing the construction of voltage detection circuit according to the other embodiment.

Furthermore, as shown in FIG. 15, the mid-point voltage of the resistance R15 and the Zener diode TD15 may be supplied to the base of the transistor Q5 and the output from the collector may be voltage divided by resistances R16, R17 and R18 and may be sent out. In this case, the priority control according to 3-stage changes of the voltage level can be conducted.

Figure 16:
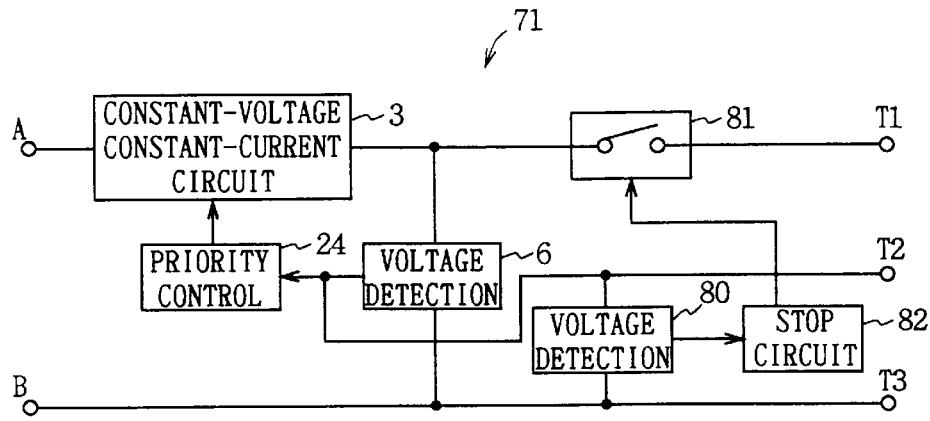
FIG. 16 is a block diagram showing the construction of charging unit according to the other embodiment.

Furthermore, the first embodiment described above has dealt with the case where the charging unit 20 stops the output voltage of the constant-voltage constant-current circuit 3 by the preference control circuit 24 as the control means. However, the present invention is not only limited to this but also, as shown by the charging unit 71 of FIG. 16, the signal level of the detection signal S1 may be detected by the voltage detection circuit 80 when the output voltage of the constant-voltage constant-current circuit 3 exceeds 4.2 volts, and switch circuit 81 provided in the electric path may be turned in OFF condition by the stop circuit 82 when its current level exceeds the predetermined threshold value. Thus, turning the switch circuit 81 in OFF condition, the charging unit 71 can shut down the electric path and can prevent output of the over-voltage.

Figure 17:
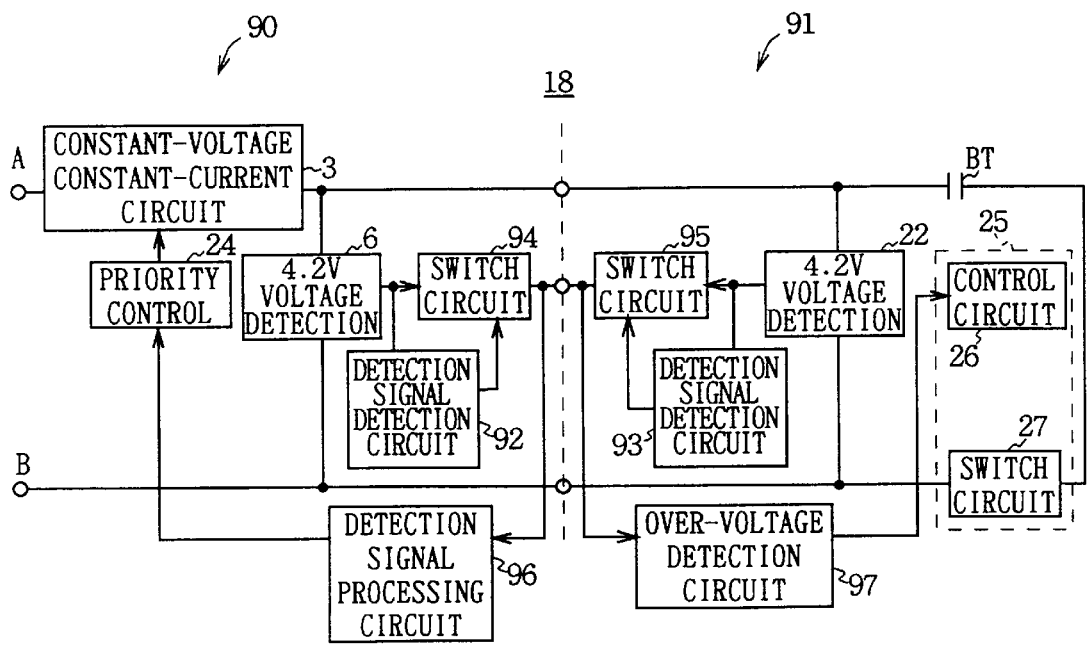
FIG. 17 is a block diagram showing the construction of charge control device according to the other embodiment.

Furthermore, the first and the second embodiments described above have dealt with the case of using charging units 20, 31 and the battery pack 21 having the constructions shown in FIGS. 3 and 6. However, the present invention is not only limited to this but also detection signals S1 and S2 to be transmitted from the voltage detection circuits 6 and 22 may be detected by detection signal detection circuits 92 and 93 when the detection voltage exceeds 4.2 volts, such as charging unit 90 and battery pack 91 of the charging control device 18 shown in FIG. 17, and when said detection signals S1 and S2 are detected, turning switch circuits 94 and 95 OFF, detection signals S1 and S2 may be transmitted.

Figure 18:
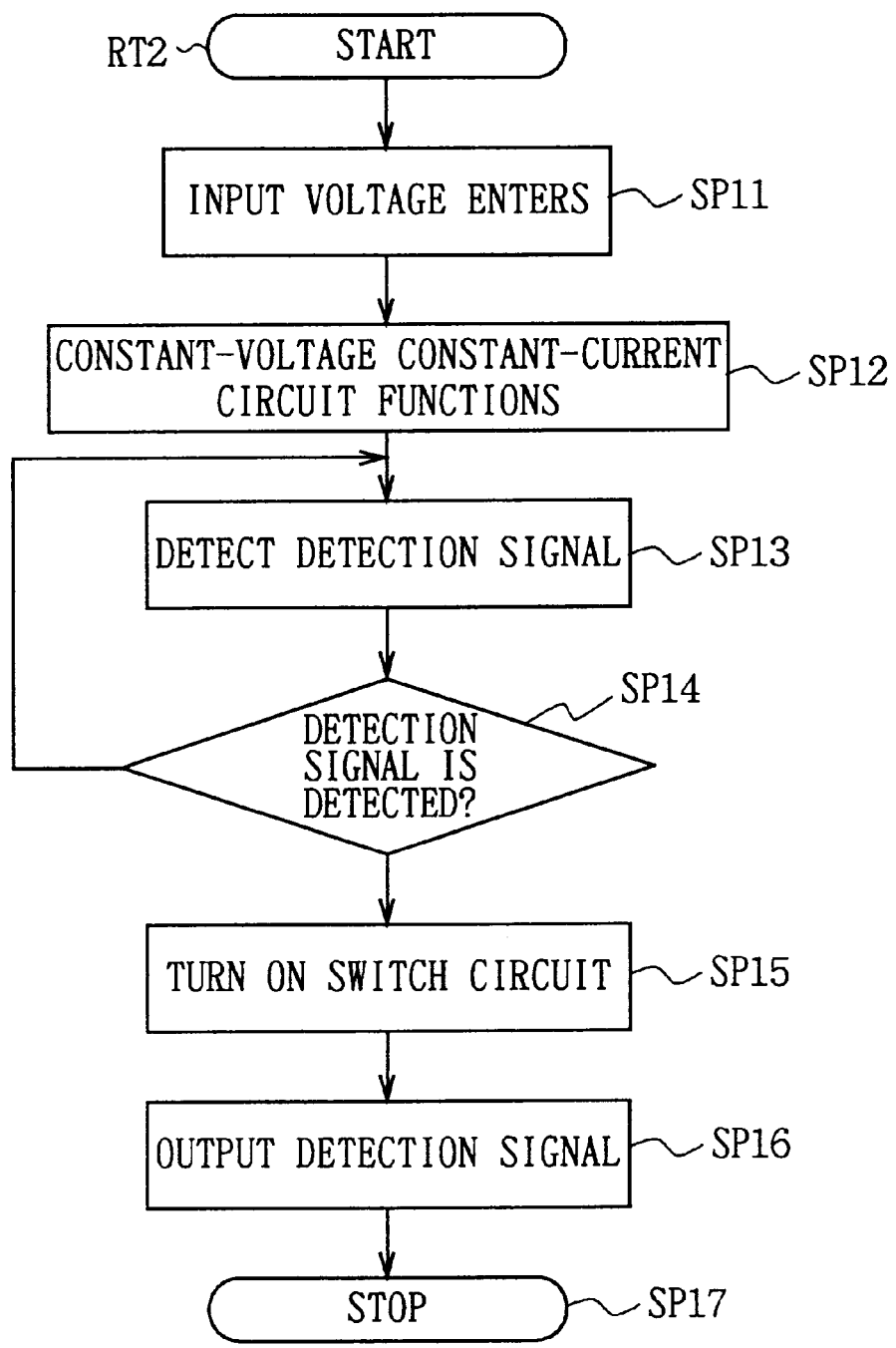
FIG. 18 is a flow chart showing the control processing procedure of switch circuit according to the other embodiment.

The control processing procedure for outputting the detection signal S1 by on/off controlling the switch circuits 94 and 95 is explained referring to a flow chart in FIG. 18. Here, the control processing procedure in the charging unit 90 is described. However, since the control processing procedure of the switch circuit 95 in the battery pack 91 is the same as those in the charging unit 90, an explanation is omitted.

In the charging unit 90, the processing enters from the start step RT2 and moves to the step SP11. At the step SP11, when the input electric source is supplied from AC adapter via input terminals A and B, the charging unit 90 moves to the step SP12.

At the step SP12, when the constant-voltage constant-current circuit 3 starts operating by using the input electric source, the charging unit 90 moves to the step SP13. At the step SP13, the charging unit 90 detects the detection signal S1 transmitted by the voltage detection circuit 6 by the detection signal detection circuit 92 and moves to the step SP14. At the step SP14, the charging unit 90 judges whether the detection signal S1 has been detected by the detection signal detection circuit 92 or not.

At the step SP14, if a negative result is obtained, this shows that the detection signal S1 has not been detected, the charging unit 90 returns to the step SP13 and detects the detection signal S1 again. At this point, since the detection signal has not been detected, the charging unit 90 does not turn the switch circuit 94 ON.

On the other hand, if an affirmative result is obtained at the step SP14, this shows that the detection signal S1 has been detected, the charging unit 90 moves to the step SP15 and turns the switch circuit 94 ON. The charging unit 90, turning the switch circuit 94 ON, transmits the detection signal S1 to the detection signal processing circuit 96 at the step SP16, and terminates the processing.

Thus, since the detection signal output circuit 96 outputs either the detection signal S1 or S2 arrived first to the priority control circuit 24 and the over-voltage detection circuit 97 outputs the detection signal S1 or S2 having the over-voltage level to the protection circuit 25, the charging control can be conducted in order of the priority control circuit 24 and the protection circuit 25 according to the signal level of the detection signal S1 or S2. And since the detection signal S1 or S2 can be transmitted via the switch circuit 94 or 95, even if one of the voltage detection circuits 6 (or 22) is out of order, the other voltage detection circuit 22 (or 6) can conduct the charging control based on the detection signal S2.

While there has been described in connection with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. A charging control device for connecting a charging unit that outputs a constant-voltage and a constant-current with a battery unit which includes a secondary battery via connecting terminals, so that said secondary battery is charged by said charging unit, wherein said charging unit comprises:

a constant-voltage constant-current circuit for supplying an output having a fixed voltage and a fixed current, and a first voltage detection circuit for comparing the fixed voltage output from said constant-voltage constant-current circuit with a first threshold level and for generating a first detection signal corresponding to a first comparison result, wherein said battery unit comprises;

a secondary battery to be charged with the output of said constant-voltage constant-current circuit, and a second voltage detection circuit for comparing a charging voltage of said secondary battery with said first threshold level and for generating a second detection signal corresponding to a second comparison result, and wherein said charging unit further comprises:

an output control circuit supplied with said first and second detection signals from said first and second detection circuits, respectively, and for stopping said output of said constant-voltage constant-current circuit when one of said first and second detection signals exceeds a second threshold level.

2. The charging control device according to claim 1, wherein said battery unit further comprises:

a protection circuit supplied with said first and second detection signals from said first and second detection circuits, respectively for cutting off an electric path supplying the output of said constant-voltage constant-current circuit to said secondary battery when one of said first and second detection signals exceeds a third threshold level.

3. The charging control device according to claim 2, wherein said third threshold level is set higher than said second threshold level.

4. The charging control device according to claim 3, wherein currents of said first and second detection signals generated respectively by said first and second detection circuits increase, when respective voltages inputted to said first and second detection circuits exceed said first threshold level.

5. The charging control device according to claim 4, wherein currents of said first and second detection signals increase rapidly.

6. The charging control device according to claim 1, wherein said charging unit further comprises:

a level control circuit for switching over said first threshold level of said first detection circuit between at least two levels corresponding to one of said first and second detection signals of said first and second detection circuits.

7. The charging control device according to claim 6, wherein said level control circuit sets said first threshold level to a lower level of the at least two levels when the voltage fed to said first detection circuit is lower than said lower level and switches said first threshold level over to a higher level of the at least two levels corresponding to said first detection signal; and when the voltage fed to said first detection circuit is higher than said higher level said level control circuit switches said first threshold level to said lower level corresponding to said first detection signal.

* * * * *